United States Patent
Sisodia et al.

(10) Patent No.: US 11,074,945 B1
(45) Date of Patent: Jul. 27, 2021

(54) TRI-STATE BUFFERING TECHNIQUES

(71) Applicant: Arm Limited, Cambridge (GB)

(72) Inventors: Rajiv Kumar Sisodia, Bangalore (IN); Kedhar Malla, Bangalore (IN); Disha Singh, Bangalore (IN)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/807,104

(22) Filed: Mar. 2, 2020

(51) Int. Cl.
  *G11C 7/10* (2006.01)
  *G11C 7/06* (2006.01)
  *G11C 7/22* (2006.01)

(52) U.S. Cl.
  CPC .............. *G11C 7/065* (2013.01); *G11C 7/106* (2013.01); *G11C 7/1057* (2013.01); *G11C 7/1075* (2013.01); *G11C 7/22* (2013.01)

(58) Field of Classification Search
  CPC ..... G11C 16/26; G11C 7/1051; G11C 7/1057; G11C 7/106; G11C 16/00; G11C 7/10; G11C 11/401; G11C 11/409; G11C 11/4093; G11C 17/10; G06F 13/40
  USPC ................. 365/189.05, 185.17, 185.25, 204; 710/16, 72
  See application file for complete search history.

(56) References Cited

U.S. PATENT DOCUMENTS

2006/0092716 A1 * 5/2006 Nam ...................... G11C 7/106
                                                                   365/189.05

* cited by examiner

*Primary Examiner* — Thong Q Le
(74) *Attorney, Agent, or Firm* — Pramudji Law Group PLLC; Ari Pramudji (57) ABSTRACT

Various implementations described herein are related to a device having a sense amplifier with multiple output ports. The device may include tri-state buffer circuitry having multiple tri-state buffers coupled to the multiple output ports of the sense amplifier. The device may include latch circuitry having multiple latches coupled to the multiple tri-state buffers of the tri-state buffer circuitry.

20 Claims, 6 Drawing Sheets

TRI-STATE BUFFERING TECHNIQUES

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some memory architectures, conventional pseudo dual-port memory designs typically use 6T bitcells for one-read/one-write operations (1RW/1RW) from both memory ports, i.e., PORTA/PORTB. For some memory, extra logic is needed to support dual-port operations, and this extra logic is typically added as bolt-on circuitry to conventional 6T bitcell designs. The sense amplifier and latch output of signal-port memory are reused for some implementations to reduce the design effort, and multiplexers can be added at the output to support the outputs of both PORTA/PORTB. Unfortunately, in reference to this conventional approach, timing associated with multiplexer control along with use of extra multiplexers typically degrades access time, even for PORTA when compared to single-port memory speeds. As such, there exists a need to improve conventional pseudo dual-port memory designs to overcome any degradation to access time.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to pseudo dual-port memory schemes and techniques. For instance, the various schemes and techniques described herein may provide for a fast access pseudo dual-port design (1RW/1RW) having a single-port (SP) tile and a dual-port (DP) tile that are arranged and configured to improve access time by avoiding the use of extra multiplexers so as to thereby reduce the delay associated with various controlling signals. In some instances, memory circuitry has multiple output data ports, such as, e.g., a first port A (PORTA) and a second port B (PORTB), that are configured to provide complementary output data signals. In this instance, corresponding to the multiple output data ports (PORTA, PORTB), the memory circuitry may include a sense amplifier having multiple output data ports, such as, e.g., SD and NSD, that provide complementary sensed data signals to the output ports (PORTA, PORTB). The memory schemes and techniques described herein may be configured to use the NSD output node of the sense amplifier (NSD) for PORTB, while also using the SD output node for PORTA (using the SD node of the sense amplifier remains the same as single-port). Thus, these modified features of the memory circuitry may allow for the same memory cells to be used for single-port and pseudo dual-port memory designs, including memory circuit designs that have programmable based functionality and operation.

The pseudo dual-port memory designs described herein may be configured to reduce the delay in access time by using the SD data along with the NSD taken from both output nodes of the sense amplifier. Thus, the various schemes and techniques described herein use the NSD node for taking the output for PORTB, while keeping the SD node for taking the output for PORTA. The schematic design for these novel features are shown in reference to the diagrams presented herein. For instance, the novel designs disclosed herein include a latch on the NSD node output (SAO_B or SAO_2) of the sense amplifier as well as the SD node output (SAO_A or SAO_1) of the sense amplifier. The controlling nodes of the tri-state buffers that couple the NSD node to SAO_B may be different than the controlling nodes of the tri-state buffers that couple SD to SAO_A.

In another instance, the various schemes and techniques described herein may also provide for pseudo dual-port memory circuitry having programmable single-port (SP) functionality along with programmable dual-port (DP) functionality. For instance, various signal paths between various circuit components may be programmable and configured to improve access time by avoiding use of extra multiplexers to thereby reduce the delay associated with various timing control signals.

Various implementations of pseudo dual-port memory schemes and techniques along with various tri-state buffering schemes and techniques associated therewith will be described in greater detail herein with reference to FIGS. 1-4.

Figure 1:
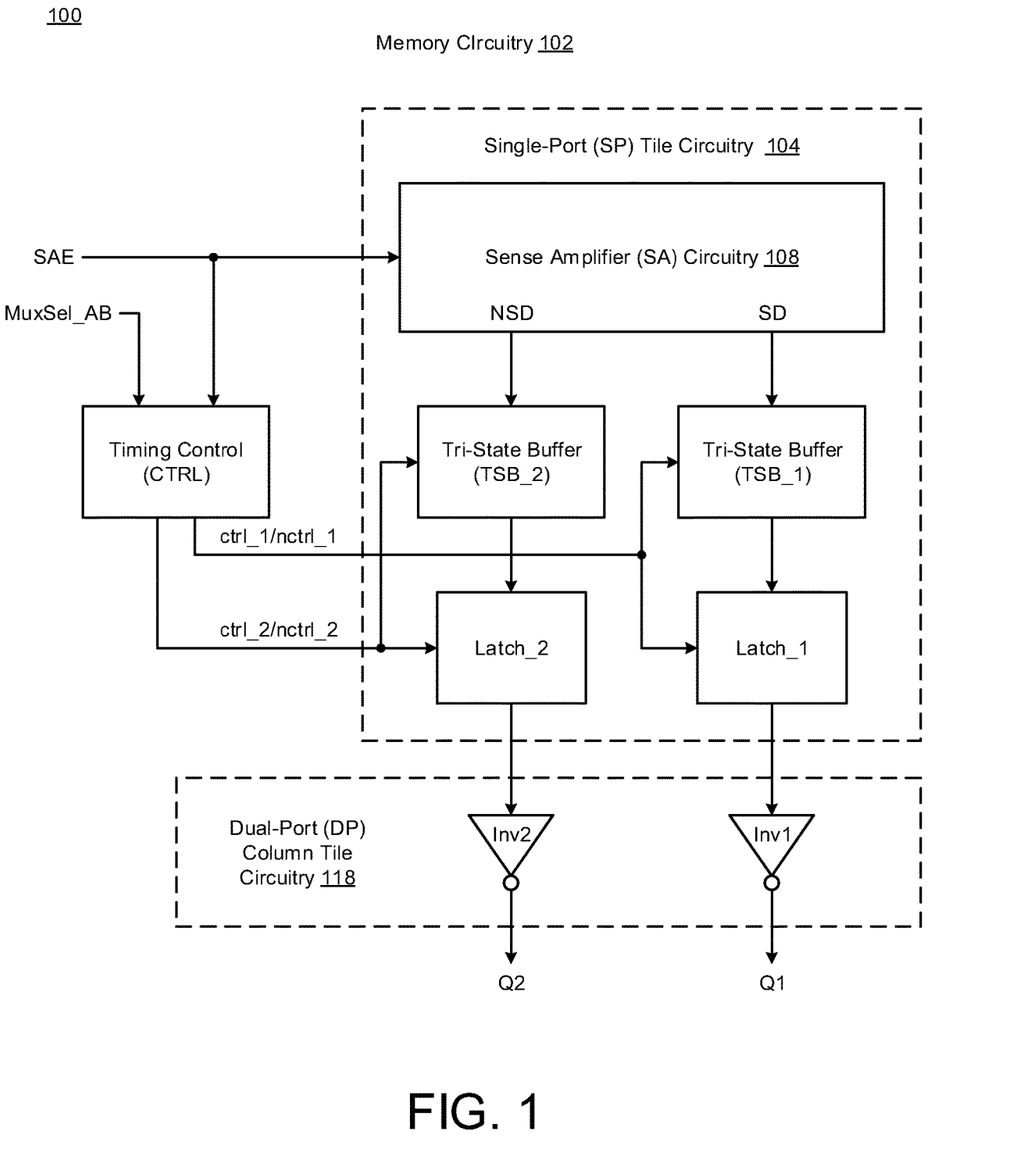
FIG. 1 illustrates a diagram of memory circuitry in accordance with various implementations described herein.

FIG. 1 illustrates a layout diagram 100 of memory circuitry 102 in accordance with various implementations described herein. In some instances, the memory circuitry 102 may be configured for use as pseudo dual-port memory circuitry. Also, the memory circuitry 102 may include single-port (SP) tile circuitry 104 and dual-port (DP) column tile circuitry 118 that are coupled together to operate as pseudo dual-port memory.

In various implementations, the memory circuitry 102 may be implemented as a system or a device having various integrated circuit (IC) components that are arranged and coupled together as an assemblage or combination of parts that provide for a physical circuit design and related structures. In some instances, a method of designing, providing and building the memory circuitry 102 as an integrated system or device that may involve use of various IC circuit components are described herein to thereby implement pseudo dual-port memory schemes and techniques associated therewith. The memory circuitry 102 may be integrated with computing circuitry and related components on a single chip, and the memory circuitry 102 may be implemented in various types of embedded systems for electronic, mobile and Internet-of-things (IoT) applications.

As shown in FIG. 1, the memory circuitry 102 may include sense amplifier (SA) circuitry 108 having a sense amplifier with multiple output ports (SD, NSD), e.g., that may be configured to provide complementary sensed data signals. In some instances, the multiple output ports (SD, NSD) of the sense amplifier 108 may include a first output port (SD) for PORTA and a second output port (NSD) for PORTB, and the sense amplifier 108 may provide a first data signal via the first output port (SD), and the sense amplifier 108 may provide a second data signal via the second output port (NSD).

The memory circuitry 102 may include tri-state buffer circuitry having multiple tri-state buffers (TSB_1, TSB_2) that are coupled to the multiple output ports (SD, NSD) of the sense amplifier 108. The multiple tri-state buffers (TSB_1, TSB_2) may include a first tri-state buffer (TSB_1) and a second tri-state buffer (TSB_2). The first tri-state buffer (TSB_1) may receive the first data signal from the first output port (SD) of the sense amplifier 108 and provide a first buffered data signal, and also, the second tri-state buffer (TSB_2) may receive the second data signal from the second output port (NSD) of the sense amplifier 108 and provide a second buffered data signal.

The memory circuitry 102 may include latch circuitry having multiple latches (Latch_1, Latch_2) that are coupled to the multiple tri-state buffers (TSB_1, TSB_2) of the tri-state buffer circuitry. The multiple latches (Latch_1, Latch_2) may include a first latch (Latch_1) and a second latch (Latch_2). The first latch (Latch_1) may receive the first buffered data signal from the first tri-state buffer (TSB_1) and provide a first latched data signal, and also, the second latch (Latch_2) may receive the second buffered data signal from the second tri-state buffer (TSB_2) and provide a second latched data signal. In some instances, the latches (Latch_1, Latch_2) may be implemented with flip-flops; however, in other instances, various other types of latches may be used.

The memory circuitry 102 may include output buffer circuitry having multiple output buffers (Inv1, Inv2) that are coupled to the multiple latches (Latch_1, Latch_2) of the latch circuitry. The multiple output buffers (Inv1, Inv2) may include a first output buffer (Inv1) and a second output buffer (Inv2). As described herein, the memory circuitry 102 may include multiple complementary output data ports, such as, e.g., the first output data port (PORTA) and the second output data port (PORTB). The first output buffer (Inv1) may receive the first latched data signal from the first latch (Latch_1) and provide a first output data signal (Q1) via the first output data port (PORTA), and also, the second output buffer (Inv2) may receive the second latched data signal from the second latch (Latch_2) and provide a second output data signal (Q2) via the second output data port (PORTB). In some instances, the output buffers (Inv1, Inv2) may be implemented with inverters; however, in other instances, various other types of buffers may be used.

The memory circuitry 102 may include timing control circuitry (CTRL) having multiple logic gates that are arranged and configured to receive a sense amplifier enable signal (SAE), receive a clock signal (e.g., MuxSel_AB), and provide multiple latch control signals (e.g., ctrl_1/nctrl_1, ctrl_2/nctrl_2) to the tri-state buffer circuitry (TSB_1, TSB_2) and/or the latch circuitry (Latch_1, Latch_2) for activation thereof. The clock signal may be referred to and used as a multiplexer select signal (MuxSel_AB), and also, the sense amplifier enable signal (SAE) along with the multiplexer select signal (MuxSel_AB) may be used to generate and provide the latch control signals (ctrl_1/nctrl_1, ctrl_2/nctrl_2) for selection of output data signals (Q1, Q2). The multiple latch control signals (ctrl_1/nctrl_1, ctrl_2/nctrl_2) may include first latch control signals (ctrl_1/nctrl_1) for selection of the first output data signal (Q1) and also second latch control signals (ctrl_2/nctrl_2) for selection of the second output data signal (Q2). Various aspects related to the latch control signals (e.g., ctrl_1/nctrl_1, ctrl_2/nctrl_2) will be described in greater detail herein below with reference to FIGS. 2A-2B and 3A-3B.

In some instances, the memory circuitry 102 may be arranged and configured as single-port (SP) tile circuitry 104 and dual-port (DP) column tile circuitry 118. As such, the sense amplifier circuitry 108, the tri-state buffer circuitry (TSB_1, TSB_2), and the latch circuitry (Latch_1, Latch_2) may be coupled together and disposed within the single-port (SP) tile circuitry 104. Also, the output buffer circuitry (Inv1, Inv2) may be disposed within the dual-port (DP) column tile circuitry 118 that is coupled to the single-port (SP) tile circuitry 104. Therefore, in various implementations, the memory circuitry 102 may be arranged and configured as single-port memory that may operate with pseudo dual-port memory functionality using various schemes and techniques described herein.

In some instances, one or more signal paths within the timing control circuitry (CTRL) may be programmable for single-port memory use or pseudo dual-port memory use, and also, one or more signal paths within the latch circuitry (Latch_1, Latch_2) may be programmable for single-port memory use or pseudo dual-port memory use. These programmable features and various other aspects associated with programmability will be described in greater detail herein below with reference to FIGS. 3A-3B.

Advantageously, the latches (Latch_1, Latch_2) may be replicated for the NSD node as well as the SD node. The tri-state of the NSD is controlled with the latch control signals (ctrl_2/nctrl_2), while the tri-state of the SD node is controlled with the latch control signals (ctrl_1/nctrl_1). These latch control signals (ctrl_1/nctrl_1, ctrl_2/nctrl_2) may be generated from the sense amplifier enable signal (SAE/NSAE) signal the port selection signal MuxSel_AB, which may default select PORTA and select PORTB for the second global timing pulse (GTP) generation. Since the output of PORTB is taken from the NSD node, the latched node may be used as the input to the final Q driver for polarity purposes, and thus, this circuit avoids extra logic stages (e.g., latch and buffer) that is present in the conventional designs. As described herein below, programming is provided to match the SD/NSD timing control signals for single port memory. Also, the MuxSel_AB signal may be default connected to logic zero (log 0). Hence, for a single port design, both ctrl_1 and ctrl_2 may be the same signals. For dual-port functionality, when READ on PORTA is done, the MuxSel_AB signal is at logic zero (log 0). Therefore, the signals ctrl_1/nctrl_1 toggle, while ctrl_2/nctrl_2 remain off, and timing of these signals may be configured to match the SAE/NSAE signals. Also, the MuxSel_AB signal goes HIGH for PORTB access to thereby select ctrl_2/nctrl_2, without impacting the PORTA latch.

Figure 2A:
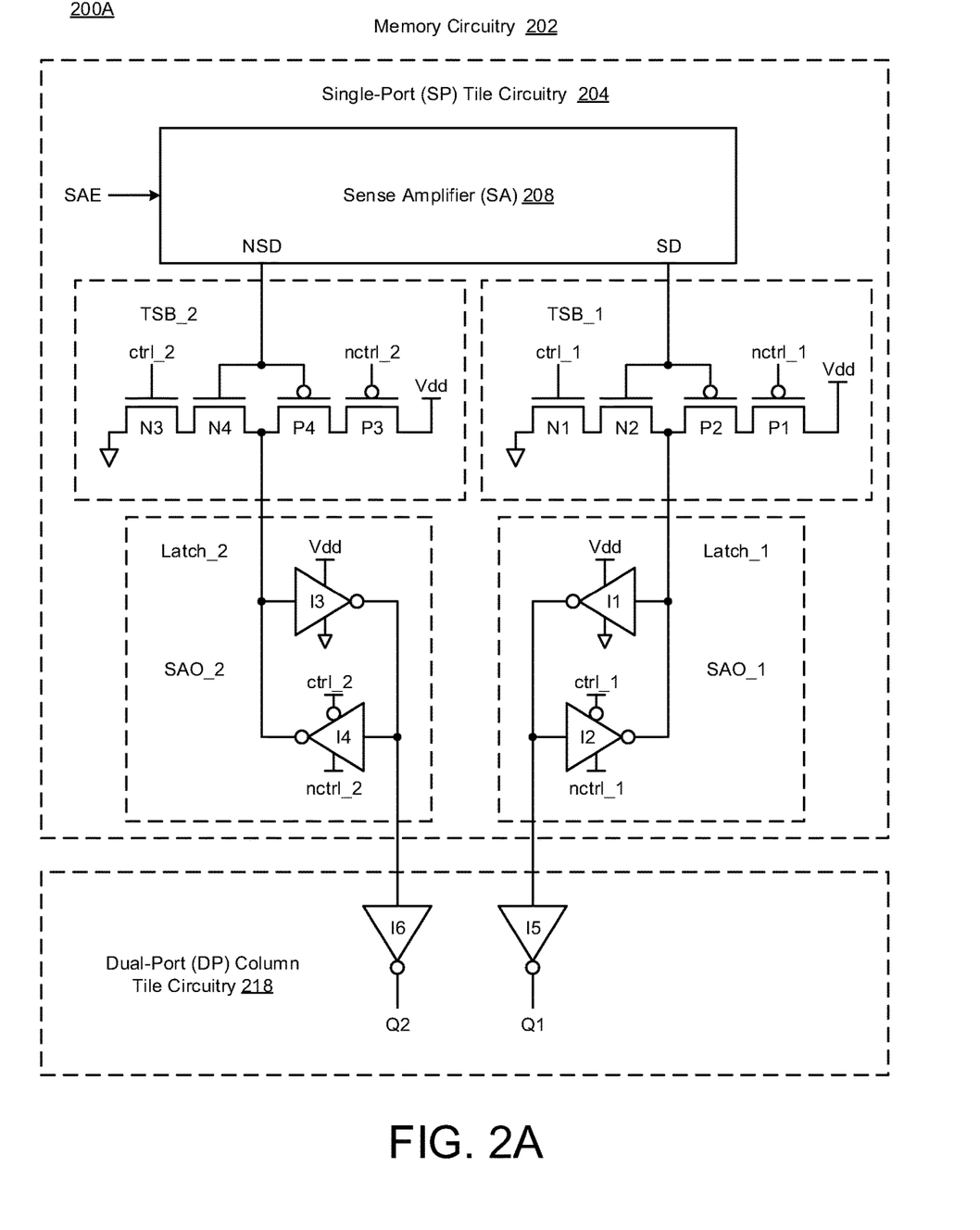
FIGS. 2A-2B illustrate diagrams of memory circuitry having a single-port tile and a dual-port tile in accordance with implementations described herein.
Figure 2B:
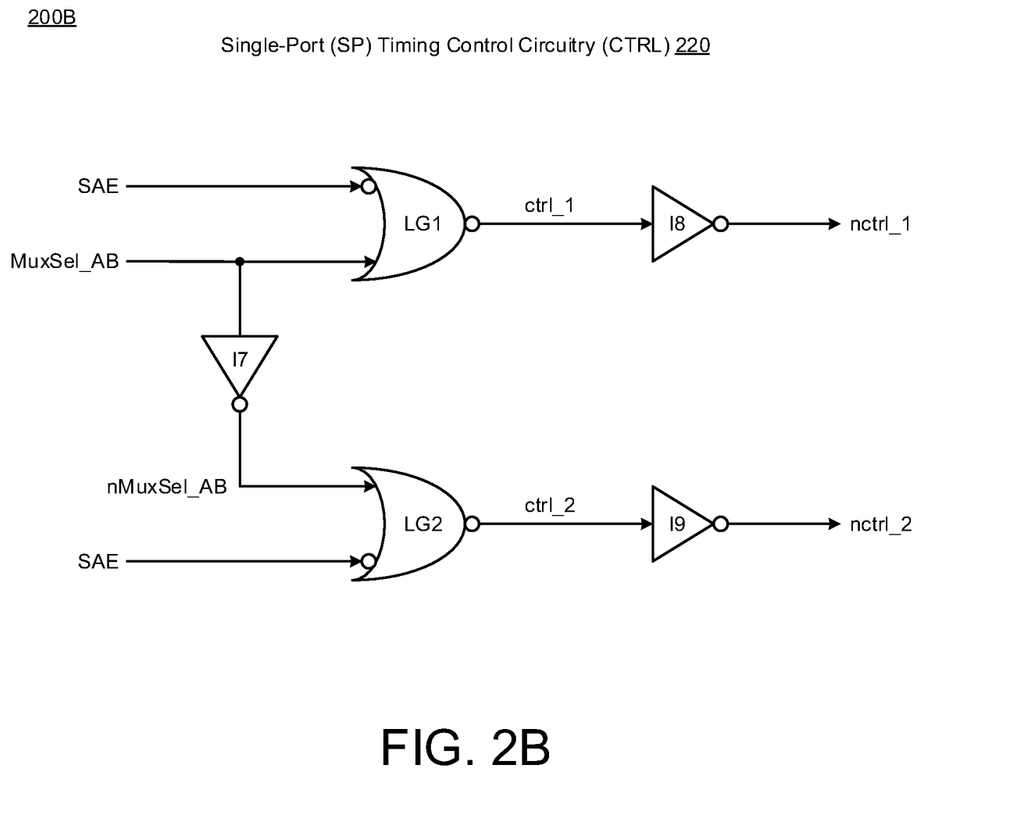

FIGS. 2A-2B illustrate diagrams of memory circuitry 202 having a single-port tile and a dual-port tile in accordance with implementations described herein. In particular, FIG. 2A shows a diagram 200A of the memory circuitry 202 having the single-port (SP) tile circuitry 204 and the dual-port (DP) column tile circuitry 218, and FIG. 2B shows a diagram 200B of the single-port (SP) timing control circuitry (CTRL) 220.

In various implementations, the memory circuitry 202 may be implemented as a system or a device having various integrated circuit (IC) components that are arranged and coupled together as an assemblage or combination of parts that provide for a physical circuit design and related structures. In some instances, a method of designing, providing and building the memory circuitry 202 as an integrated system or device that may involve use of various IC circuit components are described herein to thereby implement pseudo dual-port memory schemes and techniques associated therewith. The memory circuitry 202 may be integrated with computing circuitry and related components on a single chip, and the memory circuitry 202 may be implemented in various types of embedded systems for electronic, mobile and Internet-of-things (IoT) applications.

As shown in FIG. 2A, the memory circuitry 202 includes the single-port (SP) tile 204 and the dual-port (DP) column tile 218 having various circuit components arranged and configured for pseudo dual-port memory functionality. Thus, in some instances, the memory circuitry 202 may be configured as single-port memory that operates with pseudo dual-port memory functionality. Further, in some instances, as described herein, various signal paths within some components of the memory circuitry 202 may be programmable for single-port memory use or pseudo dual-port memory use.

The memory circuitry 202 may include a sense amplifier 208 having a first port (SD) and a second port (NSD). The sense amplifier 208 may be configured to provide a first data signal via the first port (SD), and the sense amplifier 208 may also be configured to provide a second data signal via the second port (NSD). Also, in some instances, the sense amplifier 208 may be configured to receive the sense amplifier enable signal (SAE) and provide the first data signal via the first port (SD) and the second data signal via the second port (NSD) based on the sense amplifier enable signal (SAE).

The memory circuitry 202 may include multiple tri-state buffers (TSB_1, TSB_2) having multiple transistors (e.g., P1, P2, P3, P4, N1, N2, N3, N4) that are arranged and configured to receive multiple data signals from the multiple output ports (SD, NSD) of the sense amplifier 208, receive the latch control signals (ctrl_1/nctrl_1, ctrl_2/nctrl_2) from the timing circuitry (CTRL), and provide multiple buffered data signals to the latch circuitry (Latch_1, Latch_2). Also, the multiple latches (I1, I2, I3, I4) of the latch circuitry (Latch_1, Latch_2) may include multiple logic gates (e.g., inverters: I1, I2, I3, I4) that are arranged and configured to receive the multiple buffered data signals from the tri-state buffers (TSB_1, TSB_2), receive the multiple latch control signals (ctrl_1/nctrl_1, ctrl_2/nctrl_2) from the timing circuitry (CTRL), and provide multiple latched data signals to the multiple output buffers (I5, I6), which provide the output data signals (Q1, Q2).

The memory circuitry 202 may include a first tri-state buffer (TSB_1) coupled to the first port (SD) of the sense amplifier 208, and the memory circuitry 202 may include a second tri-state buffer (TSB_2) coupled to the second port (NSD) of the sense amplifier 208. The first tri-state buffer (TSB_1) may be configured to receive the first data signal from the first port (SD) of the sense amplifier (208) and provide a first buffered data signal, and also, the second tri-state buffer (TSB_2) may be configured to receive the second data signal from the second port (NSD) of the sense amplifier 208 and provide a second buffered data signal.

In some instances, the first tri-state buffer (TSB_1) may include transistors (P1, P2, N2, N1) coupled in series between voltage supply (Vdd) and ground (Vss). Transistor (P1) may be coupled between Vdd and transistor (P2), and also, transistor (P1) may be activated with the latch control signal (nctrl_1). Transistor (P2) may be coupled between transistor (P1) and transistor (N2), and also, transistor (P2) may be activated with the first data signal from the first port (SD) of sense amplifier 208. Transistor (N2) may be coupled between transistor (P2) and transistor (N1), and also, transistor (N2) may be activated with the first data signal from the first port (SD) of the sense amplifier 208. Transistor (N1) may be coupled between transistor (N2) and ground (Vss), and also, transistor (N1) may be activated with the latch control signal (ctrl_1).

In some instances, the second tri-state buffer (TSB_2) may include transistors (P3, P4, N4, N3) coupled in series between the voltage supply (Vdd) and ground (Vss). Transistor (P3) may be coupled between Vdd and transistor (P4), and also, transistor (P3) may be activated with the latch control signal (nctrl_2). Transistor (P4) may be coupled between transistor (P3) and transistor (N4), and also, transistor (P4) may be activated with the second data signal from the second port (NSD) of sense amplifier 208. Transistor (N4) may be coupled between transistor (P4) and transistor (N3), and also, transistor (N4) may be activated with the second data signal from the second port (NSD) of the sense amplifier 208. Transistor (N3) may be coupled between transistor (N4) and ground (Vss), and also, transistor (N3) may be activated with the latch control signal (ctrl_2).

The memory circuitry 202 may include a first latch (Latch_1) coupled to the first tri-state buffer (TSB_1), and the memory circuitry 202 may also include a second latch (Latch_2) coupled to the second tri-state buffer (TSB_2). The first latch (Latch_1) may be configured to receive the first buffered data signal from the first tri-state buffer (TSB_1) and provide a first latched data signal, and the second latch (Latch_2) may be configured to receive the second buffered data signal from the second tri-state buffer (TSB_2) and provide a second latched data signal.

The memory circuitry 202 may include a first output buffer (I5) coupled to the first latch (Latch_1), and the memory circuitry 202 may also include a second output buffer (I6) coupled to the second latch (Latch_2). The first output buffer (I5) may be configured to receive the first latched data signal from the first latch (Latch_1) and provide the first output data signal (Q1) as a first output data from the memory circuitry 202. The second output buffer (I6) may be configured to receive the second latched data signal from the second latch (Latch_2) and provide the second output data signal (Q2) as a second output data from the memory circuitry 202.

In some instances, the first latch (Latch_1) may be referred to as a first sense amplifier output (SAO_1), and the first latch (Latch_1) may include multiple inverters (e.g., I1, I2) including, e.g., a first inverter (I1) and a second inverter (I2). The first inverter (I1) may be coupled between transistors (P2, N2) of the first tri-state buffer (TSB_1) and the first output buffer (I5). Also, the first inverter (I1) may have power supply terminals that are coupled between Vdd and Vss, and the second inverter (I2) may have power supply terminals that are coupled between latch control signals (ctrl_1, nctrl_1). Also, the output of the first inverter (I1) may be coupled to the input of the second inverter (I2), and the output of the second inverter (I2) may be coupled to the input of the first inverter (I1).

In some instances, the second latch (Latch_2) may be referred to as a second sense amplifier output (SAO_2), and the second latch (Latch_2) may include multiple inverters (e.g., I3, I4) including, e.g., a third inverter (I3) and a fourth inverter (I4). The third inverter (I3) may be coupled between transistors (P4, N4) of the second tri-state buffer (TSB_2) and the second output buffer (I6). Also, the third inverter (I3) may have power supply terminals that are coupled between Vdd and Vss, and the fourth inverter (I4) may have power supply terminals that are coupled between latch control signals (ctrl_2, nctrl_2). Also, the output of the third inverter (I3) may be coupled to the input of the fourth inverter (I4), and the output of the fourth inverter (I4) may be coupled to the input of the third inverter (I3).

In some implementations, the sense amplifier 208, the tri-state buffers (TSB_1, TSB_2), and the latches (Latch_1, Latch_2) may be coupled together and disposed within the single-port (SP) tile circuitry 204, and also the output buffers (I5, I6) may be disposed within the dual-port (DP) column tile circuitry 218 that is directly coupled to the single-port (SP) tile circuitry 204.

In some instances, the transistors (P1, P2, P3, P4) may be implemented with p-type metal-oxide-semiconductor (PMOS) transistors, and also, the transistors (N1, N2, N3, N4) may be implemented with n-type MOS (NMOS) transistors. However, in various other instances, various other p-type/n-type transistor arrangements and configurations may be used to receive similar signal inputs and provide similar signal outputs.

As shown in FIG. 2B, the timing control circuitry (CTRL) may refer to single-port (SP) timing control circuitry 220 having multiple logic gates (e.g., LG1, LG2, I7, I8, I9) that are arranged and configured to receive the sense amplifier enable signal (SAE) and the multiplexer select signal (MuxSel_AB) and provide the latch control signals (ctrl_1, nctrl_1, ctrl_2, nctrl_2). In some instances, the timing control circuitry (CTRL) may include a first logic gate (LG1) that receives a first input signal (SAE) at an inverting input terminal, receives a second input signal (MuxSel_AB) at another input terminal, and provides the latch control signal (ctrl_1) to inverter (I8). The timing control circuitry (CTRL) may include a second logic gate (LG2) that receives the first input signal (SAE) at an inverting input terminal, receives the second input signal (nMuxSel_AB) at another input terminal via the inverter (I7), and provides the latch control signal (ctrl_2) to inverter (I9). The inverter (I7) may receive the multiplexer select signal (MuxSel_AB) and provide its complementary multiplexer select signal (nMuxSel_AB) to the second logic gate (LG2). Also, the inverter (I8) may receive the latch control signal (ctrl_1) from the first logic gate (LG1) and provide its complementary latch control signal (nctrl_1), and the inverter (I9) may receive the latch control signal (ctrl_2) from the second logic gate (LG2) and provide its complementary latch control signal (nctrl_2).

In some instances, the logic gates (LG1, LG2) may be implemented with NOR gates or similar. However, in other instances, various other types of logic gates may be used to receive similar logical inputs and provide similar logical outputs.

Figure 3A:
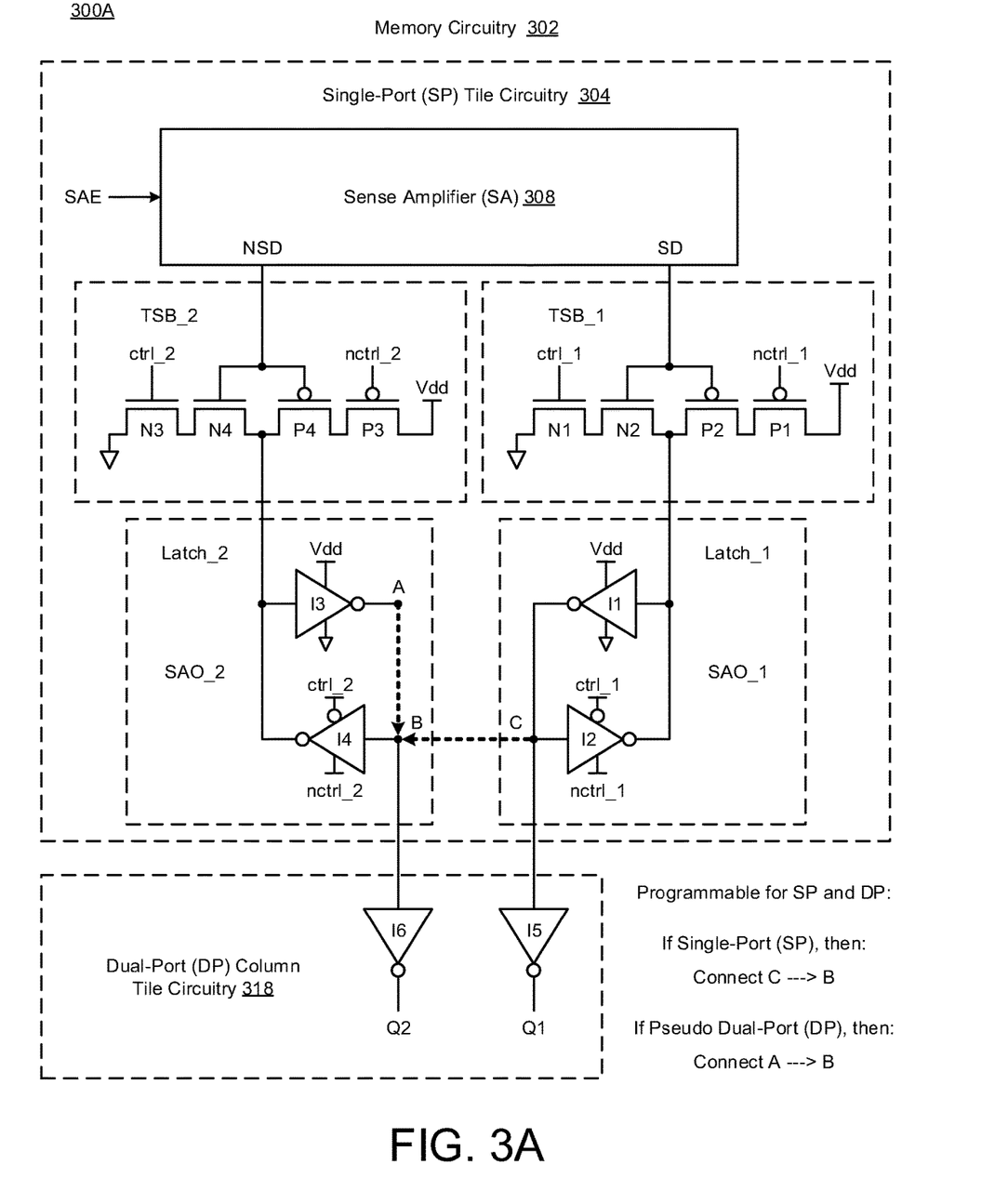
FIGS. 3A-3B illustrate diagrams of memory circuitry having a programmable single-port tile in accordance with implementations described herein.
Figure 3B:
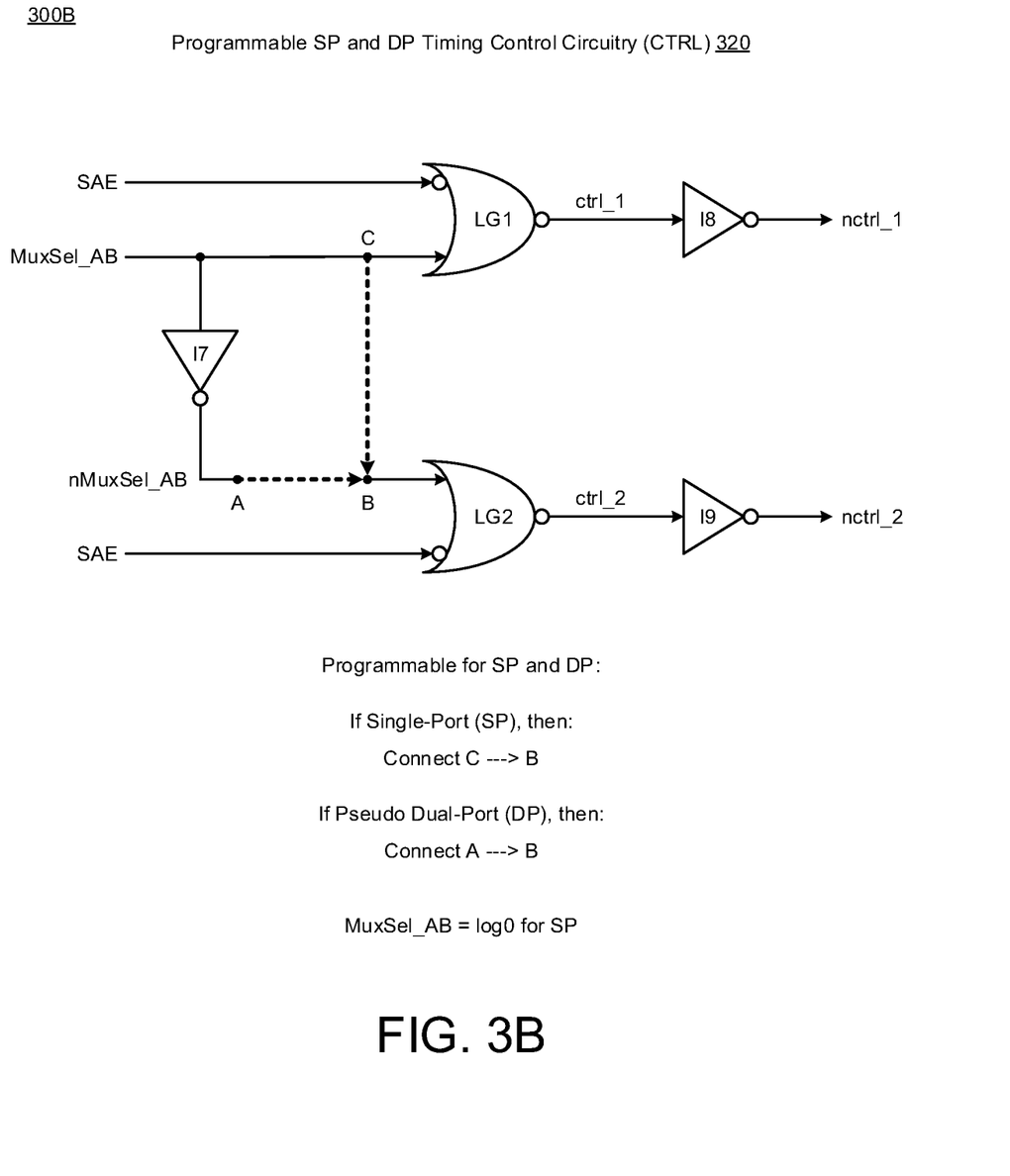

FIGS. 3A-3B illustrate diagrams of memory circuitry 302 with a programmable single-port (SP) tile 304 along with the dual-port (DP) column tile 312 in accordance with implementations described herein. In particular, FIG. 3A shows a diagram 300A of the memory circuitry 302 having programmable single-port (SP) tile circuitry 304 along with the dual-port (DP) column tile circuitry 318, and also, FIG. 3B shows a diagram 300B of programmable single-port (SP) timing control circuitry (CTRL) 320.

In various implementations, the memory circuitry 302 may be implemented as a system or a device having various integrated circuit (IC) components that are arranged and coupled together as an assemblage or combination of parts that provide for a physical circuit design and related structures. In some instances, a method of designing, providing and building the memory circuitry 302 as an integrated system or device that may involve use of various IC circuit components are described herein to thereby implement pseudo dual-port memory schemes and techniques associated therewith. In addition, the memory circuitry 302 may be integrated with programmable signal paths, and the memory circuitry 302 may be integrated with computing circuitry along with related components on a single chip. Also, the memory circuitry 302 may be implemented in various types of embedded systems for electronic, mobile and Internet-of-things (IoT) applications.

As shown in FIG. 3A, the memory circuitry 302 includes the single-port (SP) tile 304 and the dual-port (DP) column tile 318 having various circuit components arranged and configured for pseudo dual-port memory functionality. Thus, in some instances, the memory circuitry 302 may be configured as single-port memory that operates with pseudo dual-port memory functionality. Further, in some instances, as described herein, various signal paths (e.g., A, B, C) within some components of the memory circuitry 302 may be programmable for single-port memory use or pseudo dual-port memory use.

The memory circuitry 302 of FIG. 3A may include similar components along with similar circuitry having similar features and operational characteristics as the memory circuitry 202 of FIG. 2A. For instance, as shown in FIG. 3A, the memory circuitry 302 may include a sense amplifier 308, the tri-state buffers (TSB_1, TSB_2), and the latches (Latch_1, Latch_2) that are coupled together and disposed within the single-port (SP) tile circuitry 304, and also, the output buffers (I5, I6) may be disposed within the dual-port (DP) column tile circuitry 318 that is directly coupled to the SP tile circuitry 304.

However, as shown in FIG. 3A, a first programmable signal path (AB) may be disposed between node A and node B within the second latch (Latch_2), and a second programmable signal path (CB) may be disposed between node C and node B within the first and second latches (Latch_1, Latch_2). In this implementation, the memory circuitry 302 may be programmable for single-port (SP) memory applications and also for pseudo dual-port (DP) memory applications. Thus, when a single-port (SP) memory configuration is to be programmed in the memory circuitry 302, then node C is conductively connected to node B to thereby provide a connective signal path (or link) between the nodes (CB), and further, when a pseudo dual-port (DP) memory configuration is to be programmed in the memory circuitry 302, then node A is conductively connected to node B to thereby provide a connective signal path (or link) between the nodes (AB).

In FIG. 3B, the timing control circuitry (CTRL) refers to programmable single-port (SP) and dual port (DP) timing control circuitry 320. As shown in FIG. 3B, the timing control circuitry 320 may include single-port (SP) logic having various circuit components that are arranged and configured for pseudo dual-port memory functionality. For instance, the timing control circuitry 320 may be configured for single-port memory applications that operate with pseudo dual-port memory functionality. Further, in some instances, various signal paths (e.g., A, B, C) within some components of the timing control circuitry 302 may be programmable for single-port memory use or pseudo dual-port memory use.

The timing control circuitry 320 of FIG. 3B may include similar components along with similar circuitry having similar features and operational characteristics as the timing control circuitry 220 of FIG. 2B. For instance, as shown in FIG. 3B, the timing control circuitry 320 may include multiple logic gates (LG1, LG2, I7, I8, I9) that are coupled together and disposed within the single-port timing control circuitry 320.

However, as shown in FIG. 3B, a first programmable signal path (AB) may be disposed between node A and node B, and a second programmable signal path (CB) may be disposed between node C and node B. For instance, in this implementation, the timing control circuitry 320 may be programmable for single-port (SP) memory applications and also for pseudo dual-port (DP) memory applications. Therefore, when the single-port (SP) memory configuration is to be programmed in the timing control circuitry 320, then node C may be conductively connected to node B to thereby provide a connective signal path (or link) between the nodes (CB). Also, for single-port (SP) memory applications, the multiplexer select signal (MuxSel_AB) may be grounded or tied to logic zero (i.e., log 0), wherein the MuxSel_AB=log for SP applications. Further, in some instances, when the pseudo dual-port (DP) memory configuration is to be programmed in the timing control circuitry 320, then node A may be conductively connected to node B to thereby provide a connective signal path (or link) between the nodes (AB).

Figure 4:
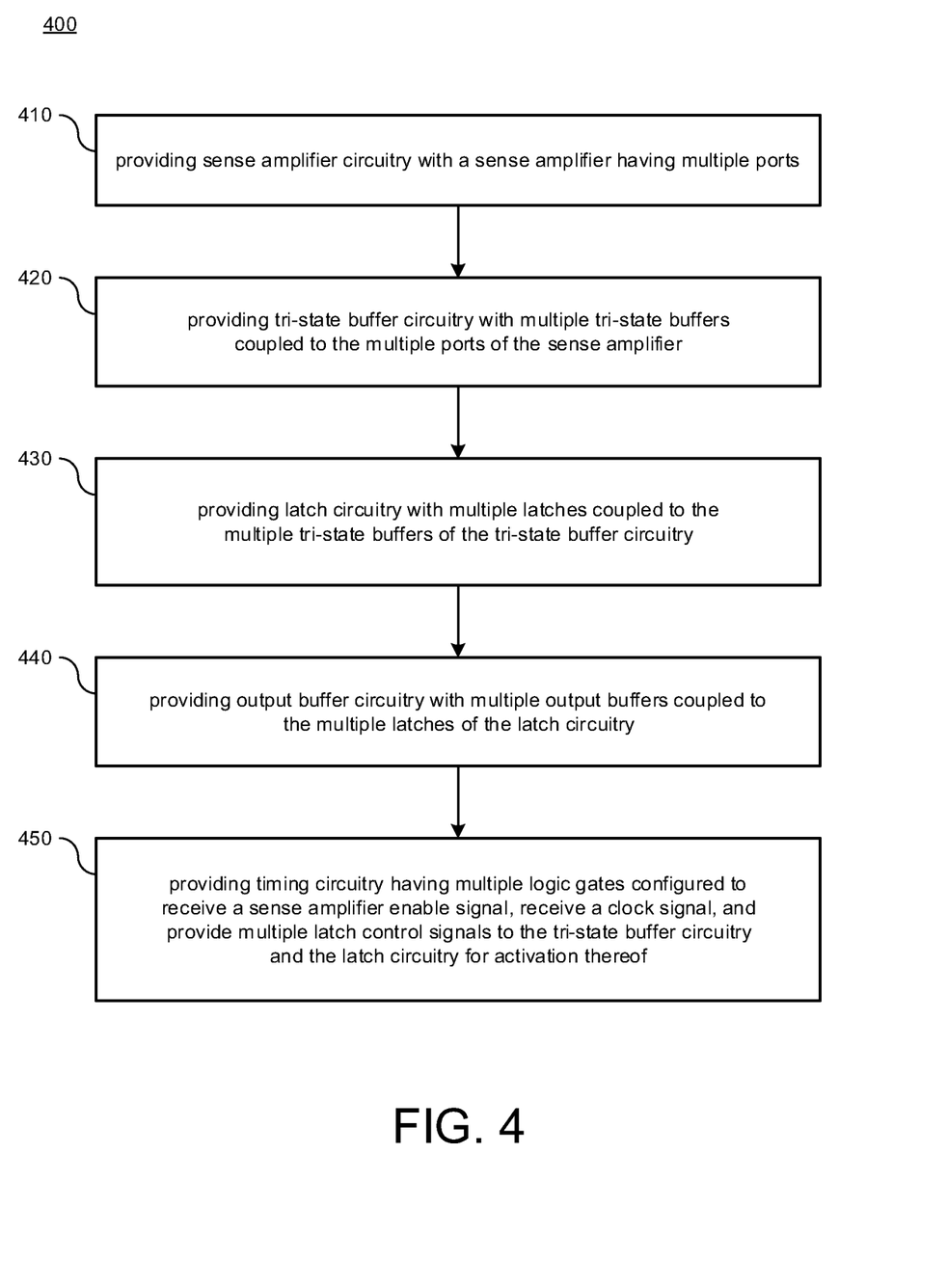
FIG. 4 illustrates a process diagram of a method for providing pseudo dual-port memory in accordance with various implementations described herein.

FIG. 4 illustrates a diagram of a method 400 for providing pseudo dual-port memory in accordance with various implementations described herein.

It should be understood that, even though method 400 indicates a particular order of operation execution, various certain portions of the operations may be executed in a different order, and on different systems. In other cases, additional operations and/or steps may be added to and/or omitted from method 400. In addition, method 400 may be implemented in hardware and/or software. If implemented in hardware, method 400 may be implemented with various components and/or circuitry, as described herein above in reference to FIGS. 1-3B. If implemented in software, method 400 may be implemented as a program and/or software instruction process configured for providing pseudo dual-port memory schemes and techniques, as described herein. Further, if implemented in software, instructions related to implementing the method 400 may be stored in memory and/or a database. For instance, a computer or various other types of computing devices having a processor and memory may be configured to perform method 400.

In various implementations, method 400 may refer to a method of designing, providing, building, fabricating and/or manufacturing pseudo dual-port memory circuitry as an integrated system, device and/or circuit that may involve use of the various IC circuit components are described herein so as to implement pseudo dual-port memory schemes and techniques associated therewith. The pseudo dual-port memory may be integrated with computing circuitry and related components on a single chip, and the pseudo dual-port memory may be implemented in various embedded systems for various electronic, mobile and Internet-of-things (IoT) applications, including sensor nodes.

At block 410, method 400 may provide sense amplifier circuitry with a sense amplifier having multiple ports. In some instances, the multiple output ports of the sense amplifier may include a first output port and a second output port. In addition, the sense amplifier may provide a first data signal via the first output port, and the sense amplifier may provide a second data signal via the second output port.

At block 420, method 400 may provide tri-state buffer circuitry with multiple tri-state buffers that are coupled to the multiple ports of the sense amplifier. The multiple tri-state buffers may include a first tri-state buffer and a second tri-state buffer. The first tri-state buffer may receive the first data signal from the first output port of the sense amplifier and provide a first buffered data signal, and the second tri-state buffer may receive the second data signal from the second output port of the sense amplifier and provide a second buffered data signal.

At block 430, method 400 may provide latch circuitry with multiple latches that are coupled to the multiple tri-state buffers of the tri-state buffer circuitry. The multiple latches may include a first latch and a second latch. The first latch may receive the first buffered data signal from the first tri-state buffer and provide a first latched data signal, and the second latch may receive the second buffered data signal from the first tri-state buffer and provide a second latched data signal.

At block 440, method 400 may provide output buffer circuitry with multiple output buffers that are coupled to the multiple latches of the latch circuitry. The multiple output buffers may include a first output buffer and a second output buffer. The first output buffer may receive the first latched data signal from the first latch and provide a first output data signal, and the second output buffer may receive the second latched data signal from the second latch and provide a second output data signal.

At block 450, method 400 may provide timing circuitry having multiple logic gates arranged and configured to receive a sense amplifier enable signal, receive a clock signal, and provide multiple latch control signals to the tri-state buffer circuitry and the latch circuitry for activation thereof. In some instances, one or more signal paths within the timing circuitry may be programmable for single-port memory use or pseudo dual-port memory use. Also, the multiple tri-state buffers may include multiple transistors that are arranged and configured to receive multiple data signals from the multiple output ports of the sense amplifier circuitry, receive multiple latch control signals from the timing circuitry, and provide multiple buffered data signals to the latch circuitry. Also, in some instances, the multiple latches may include multiple logic gates that are arranged and configured to receive the multiple buffered data signals from the multiple tri-state buffers, receive the multiple latch control signals from the timing circuitry, and then provide multiple latched data signals to multiple output buffers.

In some instances, the sense amplifier circuitry, the tri-state buffer circuitry, and the latch circuitry are coupled together and disposed within single-port (SP) tile circuitry, and also, the output buffer circuitry is disposed within dual-port (DP) column tile circuitry that is coupled to the single-port (SP) tile circuitry. Also, in some instances, method 400 may be used to fabricate a device having single-port memory that operates with pseudo dual-port memory functionality. Accordingly, in some instances, one or more signal paths within the latch circuitry may be programmable and therefore configured for single-port memory use or pseudo dual-port memory use.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include sense amplifier circuitry having a sense amplifier with multiple output ports. The device may include tri-state buffer circuitry having multiple tri-state buffers coupled to the multiple output ports of the sense amplifier. The device may include latch circuitry having multiple latches coupled to the multiple tri-state buffers of the tri-state buffer circuitry.

Described herein are various implementations of a memory circuit having a single port tile, and the single port tile may include a sense amplifier having a first port and a second port. The single port tile may include a first tri-state buffer coupled to the first port of the sense amplifier, and the single port tile may include a second tri-state buffer coupled to the second port of the sense amplifier. Also, the single port tile may include a first latch coupled to the first tri-state buffer, and the single port tile may include a second latch coupled to the second tri-state buffer.

Described herein are various implementations of a method for providing sense amplifier circuitry with a sense amplifier having multiple ports. The method may include providing tri-state buffer circuitry with multiple tri-state buffers coupled to the multiple ports of the sense amplifier. Also, the method may include providing latch circuitry with multiple latches coupled to the multiple tri-state buffers of the tri-state buffer circuitry.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
   sense amplifier circuitry having a sense amplifier with multiple output ports;
   tri-state buffer circuitry having multiple tri-state buffers coupled to the multiple output ports of the sense amplifier; and
   latch circuitry having multiple latches coupled to the multiple tri-state buffers of the tri-state buffer circuitry.

2. The device of claim 1, further comprising:
   output buffer circuitry having multiple output buffers coupled to the multiple latches of the latch circuitry.

3. The device of claim 2, wherein the sense amplifier circuitry, the tri-state buffer circuitry, and the latch circuitry are coupled together and disposed within single-port (SP) tile circuitry, and wherein the output buffer circuitry is disposed within dual-port (DP) column tile circuitry that is coupled to the single-port (SP) tile circuitry.

4. The device of claim 1, wherein the multiple output ports of the sense amplifier include a first output port and a second output port, and wherein the sense amplifier provides a first data signal via the first output port, and wherein the sense amplifier provides a second data signal via the second output port.

5. The device of claim 4, wherein the multiple tri-state buffers include a first tri-state buffer and a second tri-state buffer, and wherein the first tri-state buffer receives the first data signal from the first output port of the sense amplifier and provides a first buffered data signal, and wherein the second tri-state buffer receives the second data signal from the second output port of the sense amplifier and provides a second buffered data signal.

6. The device of claim 5, wherein the multiple latches include a first latch and a second latch, and wherein the first latch receives the first buffered data signal from the first tri-state buffer and provides a first latched data signal, and wherein the second latch receives the second buffered data signal from the second tri-state buffer and provides a second latched data signal.

7. The device of claim 6, further comprising:
   output buffer circuitry having multiple output buffers including a first output buffer and a second output buffer, wherein the first output buffer receives the first latched data signal from the first latch and provides a first output data signal, and wherein the second output buffer receives the second latched data signal from the second latch and provides a second output data signal.

8. The device of claim 1, further comprising:
timing circuitry having multiple logic gates arranged and configured to receive a sense amplifier enable signal, receive a clock signal, and provide multiple latch control signals to the tri-state buffer circuitry and the latch circuitry for activation thereof.

9. The device of claim 8, wherein one or more signal paths within the timing circuitry are programmable for single-port memory use or pseudo dual-port memory use.

10. The device of claim 8, wherein the multiple tri-state buffers include multiple transistors that are arranged and configured to receive multiple data signals from the multiple output ports of the sense amplifier circuitry, receive the multiple latch control signals from the timing circuitry, and provide multiple buffered data signals to the latch circuitry.

11. The device of claim 10, wherein the multiple latches include multiple logic gates that are arranged and configured to receive the multiple buffered data signals from the multiple tri-state buffers, receive the multiple latch control signals from the timing circuitry, and provide multiple latched data signals to multiple output buffers.

12. The device of claim 1, wherein the device comprises a single-port memory device that operates with pseudo dual-port memory functionality.

13. The device of claim 1, wherein one or more signal paths within the latch circuitry are programmable for single-port memory use or pseudo dual-port memory use.

14. A memory circuit, comprising:
a single-port tile having:
  a sense amplifier having a first port and a second port,
  a first tri-state buffer coupled to the first port of the sense amplifier,
  a second tri-state buffer coupled to the second port of the sense amplifier,
  a first latch coupled to the first tri-state buffer, and
  a second latch coupled to the second tri-state buffer.

15. The circuit of claim 14, wherein the sense amplifier provides a first data signal via the first port, and wherein the sense amplifier provides a second data signal via the second port.

16. The circuit of claim 15, wherein the first tri-state buffer receives the first data signal from the first port of the sense amplifier and provides a first buffered data signal, and wherein the second tri-state buffer receives the second data signal from the second port of the sense amplifier and provides a second buffered data signal.

17. The circuit of claim 16, wherein the first latch receives the first buffered data signal from the first tri-state buffer and provides a first latched data signal, and wherein the second latch receives the second buffered data signal from the second tri-state buffer and provides a second latched data signal.

18. The circuit of claim 17, further comprising:
a dual-port column tile having a first output buffer coupled to the first latch and a second output buffer coupled to the second latch,
wherein the first output buffer receives the first latched data signal from the first latch and provides a first output data signal, and wherein the second output buffer receives the second latched data signal from the second latch and provides a second output data signal.

19. A method, comprising:
providing sense amplifier circuitry with a sense amplifier having multiple ports;
providing tri-state buffer circuitry with multiple tri-state buffers coupled to the multiple ports of the sense amplifier; and
providing latch circuitry with multiple latches coupled to the multiple tri-state buffers of the tri-state buffer circuitry.

20. The method of claim 19, further comprising:
providing output buffer circuitry with multiple output buffers coupled to the multiple latches of the latch circuitry.

* * * * *